(12) United States Patent
Kato et al.

(10) Patent No.: US 7,871,008 B2
(45) Date of Patent: Jan. 18, 2011

(54) WIRELESS IC DEVICE AND MANUFACTURING METHOD THEREOF

(75) Inventors: Noboru Kato, Moriyama (JP); Yutaka Sasaki, Nagaokakyo (JP); Masahiro Ozawa, Yawata (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/432,854

(22) Filed: Apr. 30, 2009

(65) Prior Publication Data

US 2009/0321527 A1    Dec. 31, 2009

(30) Foreign Application Priority Data

Jun. 25, 2008    (JP) .............................. 2008-165846

(51) Int. Cl.
*G06K 7/00* (2006.01)
*H01L 23/02* (2006.01)
*H01L 23/12* (2006.01)

(52) U.S. Cl. ...................... 235/486; 235/435; 257/678; 257/679; 257/700

(58) Field of Classification Search ................. 235/486, 235/487, 492
See application file for complete search history.

(56) References Cited

U.S. PATENT DOCUMENTS

| | | | |
|---|---|---|---|
| 3,364,564 A | 1/1968 | Kurtz et al. | |
| 4,794,397 A | 12/1988 | Ohe et al. | |
| 5,232,765 A | 8/1993 | Yano et al. | |
| 5,253,969 A | 10/1993 | Richert | |
| 5,337,063 A | 8/1994 | Takahira | |
| 5,374,937 A | 12/1994 | Tsunekawa et al. | |
| 5,399,060 A | 3/1995 | Richert | |
| 5,491,483 A | 2/1996 | D'Hont | |
| 5,757,074 A | 5/1998 | Matloubian et al. | |

(Continued)

FOREIGN PATENT DOCUMENTS

EP    0 694 874 A2    1/1996

(Continued)

OTHER PUBLICATIONS

Official communication issued in Japanese Application No. 2007-531524, mailed on Sep. 11, 2007.

(Continued)

*Primary Examiner*—Michael G Lee
*Assistant Examiner*—Laura Gudorf
(74) *Attorney, Agent, or Firm*—Keating & Bennett, LLP

(57) ABSTRACT

A wireless IC device includes a radiation plate, a wireless IC chip, and a substrate provided with a feed circuit that includes a resonant circuit and/or the matching circuit including an inductance element and that is electromagnetically coupled to the radiation plate. The substrate is made of a resin material. A recess is provided in a first main surface of the substrate. The substrate is provided with a wiring electrode arranged along a bottom surface and an inner circumferential surface of the recess and the first main surface of the substrate and electrically connected to the feed circuit, and a wedge member made of a different material from the resin material and extending between the bottom surface of the recess and a second main surface of the substrate spaced apart from the wiring electrode. The wireless IC chip is mounted in the recess and coupled to the wiring electrode.

18 Claims, 12 Drawing Sheets

U.S. PATENT DOCUMENTS

| | | | |
|---|---|---|---|
| 5,796,165 | A * | 8/1998 | Yoshikawa et al. .......... 257/728 |
| 5,903,239 | A | 5/1999 | Takahashi et al. |
| 5,936,150 | A | 8/1999 | Kobrin et al. |
| 5,955,723 | A | 9/1999 | Reiner |
| 5,995,006 | A | 11/1999 | Walsh |
| 6,104,311 | A | 8/2000 | Lastinger |
| 6,107,920 | A | 8/2000 | Eberhardt et al. |
| 6,172,608 | B1 | 1/2001 | Cole |
| 6,181,287 | B1 | 1/2001 | Beigel |
| 6,190,942 | B1 | 2/2001 | Wilm et al. |
| 6,259,157 | B1 * | 7/2001 | Sakamoto et al. .......... 257/723 |
| 6,259,369 | B1 | 7/2001 | Monico |
| 6,271,803 | B1 | 8/2001 | Watanabe et al. |
| 6,335,686 | B1 | 1/2002 | Goff et al. |
| 6,362,784 | B1 | 3/2002 | Kane et al. |
| 6,367,143 | B1 | 4/2002 | Sugimura |
| 6,378,774 | B1 | 4/2002 | Emori et al. |
| 6,406,990 | B1 | 6/2002 | Kawai |
| 6,448,874 | B1 | 9/2002 | Shiino et al. |
| 6,462,716 | B1 | 10/2002 | Kushihi |
| 6,542,050 | B1 | 4/2003 | Arai et al. |
| 6,600,459 | B2 | 7/2003 | Yokoshima et al. |
| 6,634,564 | B2 | 10/2003 | Kuramochi |
| 6,664,645 | B2 | 12/2003 | Kawai |
| 6,763,254 | B2 | 7/2004 | Nishikawa |
| 6,828,881 | B2 | 12/2004 | Mizutani et al. |
| 6,927,738 | B2 | 8/2005 | Senba et al. |
| 6,963,729 | B2 | 11/2005 | Uozumi |
| 7,088,307 | B2 | 8/2006 | Imaizumi |
| 7,112,952 | B2 | 9/2006 | Arai et al. |
| 7,119,693 | B1 | 10/2006 | Devilbiss |
| 7,129,834 | B2 | 10/2006 | Naruse et al. |
| 7,248,221 | B2 | 7/2007 | Kai et al. |
| 7,250,910 | B2 | 7/2007 | Yoshikawa et al. |
| 7,276,929 | B2 | 10/2007 | Arai et al. |
| 7,317,396 | B2 | 1/2008 | Ujino |
| 7,405,664 | B2 | 7/2008 | Sakama et al. |
| 2002/0011967 | A1 | 1/2002 | Goff et al. |
| 2002/0044092 | A1 | 4/2002 | Kushihi |
| 2002/0067316 | A1 | 6/2002 | Yokoshima et al. |
| 2003/0020661 | A1 | 1/2003 | Sato |
| 2004/0001027 | A1 | 1/2004 | Killen et al. |
| 2004/0066617 | A1 | 4/2004 | Hirabayashi et al. |
| 2004/0217915 | A1 | 11/2004 | Imaizumi |
| 2004/0219956 | A1 | 11/2004 | Iwai et al. |
| 2004/0227673 | A1 | 11/2004 | Iwai et al. |
| 2005/0092836 | A1 | 5/2005 | Kudo |
| 2005/0099337 | A1 | 5/2005 | Takei et al. |
| 2005/0125093 | A1 | 6/2005 | Kikuchi et al. |
| 2005/0140512 | A1 | 6/2005 | Sakama et al. |
| 2005/0232412 | A1 | 10/2005 | Ichihara et al. |
| 2005/0236623 | A1 | 10/2005 | Takechi et al. |
| 2005/0275539 | A1 | 12/2005 | Sakama et al. |
| 2006/0001138 | A1 | 1/2006 | Sakama et al. |
| 2006/0055601 | A1 | 3/2006 | Kameda et al. |
| 2006/0071084 | A1 | 4/2006 | Detig et al. |
| 2006/0109185 | A1 | 5/2006 | Iwai et al. |
| 2006/0145872 | A1 | 7/2006 | Tanaka et al. |
| 2006/0158380 | A1 | 7/2006 | Son et al. |
| 2006/0170606 | A1 | 8/2006 | Yamagajo et al. |
| 2006/0171130 | A1 * | 8/2006 | Konishi et al. .............. 361/760 |
| 2006/0267138 | A1 | 11/2006 | Kobayashi |
| 2007/0004028 | A1 | 1/2007 | Lair et al. |
| 2007/0018893 | A1 | 1/2007 | Kai et al. |
| 2007/0040028 | A1 | 2/2007 | Kawamata |
| 2007/0052613 | A1 | 3/2007 | Gallschuetz et al. |
| 2007/0164414 | A1 * | 7/2007 | Dokai et al. ................. 257/679 |
| 2007/0252700 | A1 | 11/2007 | Ishihara et al. |
| 2007/0285335 | A1 | 12/2007 | Bungo et al. |
| 2008/0024156 | A1 | 1/2008 | Arai et al. |
| 2008/0087990 | A1 | 4/2008 | Kato et al. |
| 2008/0169905 | A1 | 7/2008 | Slatter |
| 2008/0272885 | A1 | 11/2008 | Atherton |
| 2009/0002130 | A1 | 1/2009 | Kato |

FOREIGN PATENT DOCUMENTS

| | | | |
|---|---|---|---|
| EP | 0 977 145 | A2 | 2/2000 |
| JP | 50-143451 | A | 11/1975 |
| JP | 62-127140 | U | 8/1987 |
| JP | 03-262313 | A | 11/1991 |
| JP | 04-150011 | A | 5/1992 |
| JP | 05-327331 | A | 12/1993 |
| JP | 6-53733 | | 2/1994 |
| JP | 06-077729 | A | 3/1994 |
| JP | 06-177635 | A | 6/1994 |
| JP | 07-183836 | A | 7/1995 |
| JP | 08-056113 | A | 2/1996 |
| JP | 8-87580 | A | 4/1996 |
| JP | 11-149537 | A | 6/1996 |
| JP | 08-176421 | A | 7/1996 |
| JP | 08-279027 | A | 10/1996 |
| JP | 08-307126 | A | 11/1996 |
| JP | 08-330372 | A | 12/1996 |
| JP | 09-014150 | A | 1/1997 |
| JP | 09-245381 | A | 9/1997 |
| JP | 09-252217 | A | 9/1997 |
| JP | 09-270623 | A | 10/1997 |
| JP | 9-512367 | A | 12/1997 |
| JP | 10-069533 | A | 3/1998 |
| JP | 10-505466 | A | 5/1998 |
| JP | 10-171954 | A | 6/1998 |
| JP | 10-293828 | A | 11/1998 |
| JP | 11-039441 | A | 2/1999 |
| JP | 11-085937 | A | 3/1999 |
| JP | 11-149538 | A | 6/1999 |
| JP | 11-219420 | A | 8/1999 |
| JP | 11-220319 | A | 8/1999 |
| JP | 11-328352 | A | 11/1999 |
| JP | 11-346114 | A | 12/1999 |
| JP | 11-515094 | A | 12/1999 |
| JP | 2000-21128 | A | 1/2000 |
| JP | 2000-021639 | A | 1/2000 |
| JP | 2000-022421 | A | 1/2000 |
| JP | 2005-229474 | A | 1/2000 |
| JP | 2000-059260 | A | 2/2000 |
| JP | 2000-085283 | A | 3/2000 |
| JP | 2000-090207 | A | 3/2000 |
| JP | 2000-132643 | A | 5/2000 |
| JP | 2000-137778 | A | 5/2000 |
| JP | 2000-137785 | A | 5/2000 |
| JP | 2000-148948 | A | 5/2000 |
| JP | 2000-172812 | A | 6/2000 |
| JP | 2000-510271 | A | 8/2000 |
| JP | 2000-276569 | A | 10/2000 |
| JP | 2000-286634 | A | 10/2000 |
| JP | 2000-286760 | A | 10/2000 |
| JP | 2000-311226 | A | 11/2000 |
| JP | 2000-321984 | A | 11/2000 |
| JP | 3075400 | U | 11/2000 |
| JP | 2001-028036 | A | 1/2001 |
| JP | 2007-18067 | A | 1/2001 |
| JP | 2001-043340 | A | 2/2001 |
| JP | 2001-66990 | A | 3/2001 |
| JP | 2001-505682 | A | 4/2001 |
| JP | 2001-168628 | A | 6/2001 |
| JP | 2001-240046 | A | 9/2001 |
| JP | 2001-256457 | A | 9/2001 |
| JP | 2001-514777 | A | 9/2001 |
| JP | 2001-319380 | A | 11/2001 |
| JP | 2001-331976 | A | 11/2001 |
| JP | 2001-332923 | A | 11/2001 |
| JP | 2001-344574 | A | 12/2001 |
| JP | 2001-351084 | A | 12/2001 |

| | | | | | | |
|---|---|---|---|---|---|---|
| JP | 2001-352176 A | 12/2001 | | JP | 2005-190417 A | 7/2005 |
| JP | 2002-024776 A | 1/2002 | | JP | 2005-191705 A | 7/2005 |
| JP | 2002-042076 A | 2/2002 | | JP | 2005-210676 A | 8/2005 |
| JP | 2002-063557 A | 2/2002 | | JP | 2005-210680 A | 8/2005 |
| JP | 2002-505645 A | 2/2002 | | JP | 2005-217822 A | 8/2005 |
| JP | 2002-76750 A | 3/2002 | | JP | 2005-236339 A | 9/2005 |
| JP | 2002-150245 A | 5/2002 | | JP | 2005-244778 A | 9/2005 |
| JP | 2002-175508 A | 6/2002 | | JP | 2005-275870 A | 10/2005 |
| JP | 2002-183690 A | 6/2002 | | JP | 2005-295135 A | 10/2005 |
| JP | 2002-185358 A | 6/2002 | | JP | 2005-311205 A | 11/2005 |
| JP | 2002-204117 A | 7/2002 | | JP | 2005-321305 A | 11/2005 |
| JP | 2002-522849 A | 7/2002 | | JP | 2005-335755 A | 12/2005 |
| JP | 2002-230128 A | 8/2002 | | JP | 2005-346820 A | 12/2005 |
| JP | 2002-252117 A | 9/2002 | | JP | 2005-352858 A | 12/2005 |
| JP | 2002-298109 A | 10/2002 | | JP | 2006-031766 A | 2/2006 |
| JP | 2002-319008 A | 10/2002 | | JP | 2006-39902 A | 2/2006 |
| JP | 2002-362613 A | 12/2002 | | JP | 2006-67479 A | 3/2006 |
| JP | 2002-373029 A | 12/2002 | | JP | 2006-72706 A | 3/2006 |
| JP | 2002-373323 A | 12/2002 | | JP | 2006-80367 A | 3/2006 |
| JP | 2002-374139 A | 12/2002 | | JP | 2006-92630 A | 4/2006 |
| JP | 2003-006599 A | 1/2003 | | JP | 2006-102953 A | 4/2006 |
| JP | 2003-016412 A | 1/2003 | | JP | 2006-148518 A | 6/2006 |
| JP | 2003-030612 A | 1/2003 | | JP | 2006-174151 A | 6/2006 |
| JP | 2003-44789 A | 2/2003 | | JP | 2006-195795 A | 7/2006 |
| JP | 2003-046318 A | 2/2003 | | JP | 2006-203187 A | 8/2006 |
| JP | 2003-58840 A | 2/2003 | | JP | 2006-203852 A | 8/2006 |
| JP | 2003-067711 A | 3/2003 | | JP | 2006-217000 A | 8/2006 |
| JP | 2003-069335 A | 3/2003 | | JP | 2006-232292 A | 9/2006 |
| JP | 2003-076947 A | 3/2003 | | JP | 2006-270212 A | 10/2006 |
| JP | 2003-085501 A | 3/2003 | | JP | 2006-302219 A | 11/2006 |
| JP | 2003-085520 A | 3/2003 | | JP | 2006-309401 A | 11/2006 |
| JP | 2003-87008 A | 3/2003 | | JP | 2007-043535 A | 2/2007 |
| JP | 2003-87044 A | 3/2003 | | JP | 2007-65822 A | 3/2007 |
| JP | 2003-099720 A | 4/2003 | | JP | 2007-122542 A | 5/2007 |
| JP | 2003-099721 A | 4/2003 | | JP | 2007-150868 A | 6/2007 |
| JP | 2003-110344 A | 4/2003 | | JP | 11-175678 A | 1/2009 |
| JP | 2003-132330 A | 5/2003 | | NL | 9100176 | 3/1992 |
| JP | 2003-134007 A | 5/2003 | | NL | 9100347 A | 3/1992 |
| JP | 2003-155062 A | 5/2003 | | WO | 99/67754 A1 | 12/1999 |
| JP | 2003-158414 A | 5/2003 | | WO | 00/10122 A2 | 2/2000 |
| JP | 2003-187207 A | 7/2003 | | WO | 03/079305 A1 | 9/2003 |
| JP | 2003-187211 A | 7/2003 | | WO | 2004/036772 A1 | 4/2004 |
| JP | 2003-188338 A | 7/2003 | | WO | 2004/070879 A | 8/2004 |
| JP | 2003-198230 A | 7/2003 | | WO | 2004/072892 A1 | 8/2004 |
| JP | 2003-209421 A | 7/2003 | | WO | 2005/073937 A1 | 8/2005 |
| JP | 2003-216919 A | 7/2003 | | WO | 2005/115849 A1 | 12/2005 |
| JP | 2003-218624 A | 7/2003 | | WO | 2006/045682 A | 5/2006 |
| JP | 2003-233780 A | 8/2003 | | WO | 2007/083574 A1 | 7/2007 |
| JP | 2003-242471 A | 8/2003 | | | | |
| JP | 2003-243918 A | 8/2003 | | | | |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.

Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Application No. 12/426,369, filed Apr. 20, 2009.
Kato: "Wireless IC Device"; U.S. Appl. No. 12/429,346, filed Apr. 24, 2009.

* cited by examiner

WIRELESS IC DEVICE AND MANUFACTURING METHOD THEREOF

BACKGROUND OF THE INVENTION

1. Field of the Invention

The present invention relates to a wireless IC device and a manufacturing method thereof. More specifically, the present invention relates to a wireless IC device, such as a non-contact wireless IC medium or a non-contact wireless IC tag, for example, used in an RFID (radio frequency identification) system, and a manufacturing method thereof

2. Description of the Related Art

Wireless IC devices including a module in which a wireless IC chip is mounted on a substrate and a radiation plate have been developed. In such a wireless IC device, a recess is provided in the substrate and the wireless IC chip is mounted in the recess.

Japanese Unexamined Patent Application Publication No. 2004-319848 discloses a semiconductor apparatus manufactured by forming a wiring substrate by bonding copper bumps 116a and 118a and wiring patterns 117 and 119 to both surfaces of a resin substrate 110 with prepregs 120 therebetween as shown in a sectional view in FIG. 12A, counterboring a predetermined location of the wiring substrate so as to form a recess 122 as shown in a sectional view in FIG. 12B, electrically connecting a semiconductor chip 130 to an edge surface A of the copper bump 116b exposed on the bottom surface of the recess 122 as shown in a sectional view in FIG. 12C so as to mount the semiconductor chip 130 in the recess 122, and then filling the recess 122 with a resin 124 so as to seal the semiconductor chip 130.

If a multilayer resin substrate is formed and then subjected to counterboring, which is a mechanical process, as described in Japanese Unexamined Patent Application Publication No. 2004-319848, the number of steps is increased and a counterboring apparatus is required. Thus, the manufacturing cost is increased.

In addition, since a first main surface of the resin substrate having the recess and a semiconductor chip are connected, it is difficult to provide wiring on the inner circumferential surface of the recess formed by counterboring. This makes it difficult to provide wiring having the shortest possible length and wiring must be routed such that the length thereof is increased. For example, wiring must be routed from the bottom surface of the recess 122 to a wiring pattern 117 on a second main surface of the multilayer resin substrate via the copper bump 116b and from the wiring pattern 117 on the second main surface to the first main surface via the copper bumps 116a and 118a.

When the wiring is routed as described above, an unnecessary inductor component or capacitor component occurs in a portion of the wiring. This degrades the electrical properties and/or complicates the manufacturing process, thereby causing reduced yield, for example. This disadvantageously increases the manufacturing cost.

SUMMARY OF THE INVENTION

To overcome the problems described above, preferred embodiments of the present invention provide a wireless IC device which is manufactured at a reduced cost and which prevents degradation of electrical properties, and a manufacturing method thereof.

A wireless IC device according to a first preferred embodiment of the present invention includes a radiation plate, a wireless IC chip, and a substrate on which the wireless IC chip is mounted, the substrate being provided with a feed circuit, the feed circuit including a resonant circuit and/or a matching circuit, the resonant circuit and/or the matching circuit including an inductance element, the feed circuit being electromagnetically coupled to the radiation plate. The substrate is preferably made of a resin material and includes a recess in a first main surface of the substrate. The substrate is provided with a wiring electrode arranged along a bottom surface and an inner circumferential surface of the recess and the first main surface of the substrate, the wiring electrode being electrically connected to the feed circuit, and a wedge member made of a material that is different from the resin material, the wedge member extending between the bottom surface of the recess and a second main surface of the substrate apart from the wiring electrode. The wireless IC chip is mounted in the recess and coupled to the wiring electrode.

With the above-mentioned configuration, the wireless IC chip is preferably electrically connected to the feed circuit via the wiring electrode, or electromagnetically coupled to the feed circuit via an insulating material, for example. The wedge member may preferably be made of a material that is different from that of the substrate so that the wedge member is deformed in a different manner from that of the substrate, and thus, prevents the deformation of the substrate near the recess.

With the above-mentioned configuration, the recess is easily formed in the substrate made of the resin material by pressing an area of the first main surface of the substrate that will become the recess. By simultaneously pressing the wiring electrode provided in advance in areas that will become the bottom surface and the inner circumferential surface of the recess, the wiring electrode extends along the bottom surface and the inner circumferential surface of the recess.

If a resin material is pressed and thus deformed, the deformed resin material may be deformed such that the deformed portion is restored to its original shape, that is, in a direction opposite to a direction in which the resin material has been deformed by the press. In such a case, the wedge member extending between the bottom surface of the recess and the second main surface of the substrate prevents deformation of the substrate near the recess.

The wedge member is preferably provided separately from the wiring electrode to which the wireless IC chip is electrically connected. That is, the wedge member is not electrically connected to the wireless IC chip. Therefore, the wedge member does not degrade the electrical properties of the wireless IC chip.

In addition, the first main surface of the substrate and the wireless IC chip are connected via a wiring electrode having the shortest possible length. This prevents the occurrence of an unnecessary inductor component or capacitor component in the portion of the wiring and degradation of the electrical properties thereby.

The wedge member is preferably formed by filling a through hole passing through the substrate with a conductive material.

In this case, the wedge member is easily formed. For example, the wedge member may be formed using the same or substantially the same material as that of the wiring via conductor passing through the substrate, simultaneously with the via conductor.

The feed circuit is preferably provided on the first main surface of the substrate and/or on the second main surface thereof.

In this case, a pattern of the feed circuit is preferably provided on both main surfaces of the substrate and the patterns on both the main surfaces are preferably connected through a via conductor. Thus, even if the feed circuit is downsized, it is sufficiently electromagnetically coupled to the radiation plate.

The entire wireless IC chip is preferably arranged such that the entire wireless IC chip is closer to the bottom surface of the recess than to an opening of the recess, the opening being provided near the first main surface of the substrate.

In this case, the wireless IC chip is completely housed in the recess, and thus, does not project from the substrate. For this reason, the wireless IC chip is less likely to be directly affected by external shock, for example. Thus, the reliability of the wireless IC device is improved.

A plurality of wedge members having different sizes when seen through from a direction perpendicular to the bottom surface of the recess are preferably provided. The wedge member that is larger is preferably disposed in an area closer to the center of the bottom surface of the recess. The wedge member that is smaller is preferably disposed in an area spaced away from the center of the bottom surface of the recess.

In this case, a larger wedge member is disposed in an area that is closer to the center of the recess and where a greater amount of processing deformation occurs and a larger amount of return deformation occurs. Thus, the resistance to the return deformation is increased. This more effectively prevents deformation of the substrate near the recess.

The wireless IC device preferably further includes a protection film arranged to cover the wireless IC chip mounted in the recess.

In this case, the wireless IC chip is protected from external moisture or toxic gases by the protection film. As a result, the reliability of the wireless IC device is further improved.

A method for manufacturing a wireless IC device according to a second preferred embodiment of the present invention is a method for manufacturing a wireless IC device including a radiation plate, a wireless IC chip, and a substrate on which the wireless IC chip is mounted, the substrate being provided with a feed circuit, the feed circuit including a resonant circuit and/or a matching circuit, the resonant circuit and/or the matching circuit including an inductance element, the feed circuit being electromagnetically coupled to the radiation plate. The method includes the steps of making a recess in the substrate made of a resin material by pressing a portion of a first main surface of the substrate and a portion of a wiring electrode, so that the wiring electrode extends along a bottom surface and an inner circumferential surface of the recess, the wiring electrode being formed in advance on the first main surface of the substrate and connected to the feed circuit, forming a wedge member using a different material from the resin material such that the wedge member extends between the bottom surface of the recess and a second main surface of the substrate apart from the wiring electrode, and mounting the wireless IC chip in the recess so as to couple the wireless IC chip to the wiring electrode.

By using this method, the recess is made by pressing the substrate. As a result, the manufacturing cost is reduced. In addition, since the wiring electrode is formed along the bottom surface and the inner circumferential surface of the recess, the length of the wiring routed between the wireless IC chip mounted in the recess and the first main surface of the substrate is reduced as much as possible. This prevents the routed wiring from degrading the electrical properties.

A method for manufacturing a wireless IC device according to a third preferred embodiment of the present invention is a method for manufacturing a wireless IC device including a radiation plate, a wireless IC chip, and a substrate on which the wireless IC chip is mounted, the substrate being provided with a feed circuit, the feed circuit including a resonant circuit and/or a matching circuit, the resonant circuit and/or the matching circuit including an inductance element, the feed circuit being electromagnetically coupled to the radiation plate. The method includes the steps of forming a wedge member such that the wedge member extends between a first main surface of the substrate made of a resin material and a second main surface thereof spaced apart from a wiring electrode, using a material that is different from the resin material, the wiring electrode being formed in advance on the first main surface of the substrate and connected to the feed circuit, making a recess in the substrate by pressing a portion of the first main surface of the substrate, a portion of the wiring electrode, and the wedge member, so that the wiring electrode extends along a bottom surface and an inner circumferential surface of the recess and so that the wedge member extends between the bottom surface of the recess and the second main surface of the substrate, and mounting the wireless IC chip in the recess so as to couple the wireless IC chip to the wiring electrode.

By using this method, the wedge member is hardened while the recess is formed. Thus, the height of the recess is stabilized.

In addition, since the recess is made by pressing the substrate, the manufacturing cost is reduced. Also, since the wiring electrode is formed along the bottom surface and the inner circumferential surface of the recess, the length of the wiring routed between the wireless IC chip mounted in the recess and the first main surface of the substrate is reduced as much as possible. This prevents the routed wiring from degrading the electrical properties.

A method for manufacturing a wireless IC device according to a fourth preferred embodiment of the present invention is a method for manufacturing a wireless IC device including a radiation plate, a wireless IC chip, and a substrate on which the wireless IC chip is mounted, the substrate being provided with a feed circuit, the feed circuit including a resonant circuit and/or a matching circuit, the resonant circuit and/or the matching circuit including an inductance element, the feed circuit being electromagnetically coupled to the radiation plate. The method includes the steps of forming a wedge member such that the wedge member extends between a first main surface of the substrate made of a resin material and a second main surface thereof spaced apart from a wiring electrode, using a different material from the resin material, the wiring electrode being formed in advance on the first main surface of the substrate and connected to the feed circuit, and making a recess, in which the wireless IC chip is to be embedded, in the substrate by pressing the wireless IC chip against the first main surface of the substrate in a state in which the wireless IC chip is mounted on the first main surface of the substrate such that the wireless IC chip is opposed to the wiring electrode on the substrate, so that the wiring electrode extends along a bottom surface and an inner circumferential surface of the recess and so that the wedge member extends between the bottom surface of the recess and the second main surface of the substrate.

By using this method, the formation of the recess and the mounting of the wireless IC chip are performed in one step. Thus, the recess having a stable depth is formed and the wireless IC chip is mounted stably.

In addition, since the recess is formed in the substrate by pressing the substrate via the wireless IC chip, the manufacturing cost is reduced. Also, since the wiring electrode is formed along the bottom surface and the inner circumferential surface of the recess, the length of the wiring routed between the wireless IC chip mounted in the recess and the first main surface of the substrate is reduced as much as possible. This prevents the routed wiring from degrading the electrical properties.

In accordance with the various preferred embodiments of the present invention, the manufacturing cost of the wireless IC device is reduced and degradation of the electrical properties is prevented.

Other features, elements, arrangements, steps, processes, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to FIGS. 1 to 11.

First Preferred Embodiment

A wireless IC device 10 according to a first preferred embodiment of the present invention will be described with reference to FIGS. 1 to 4.

Figure 1:
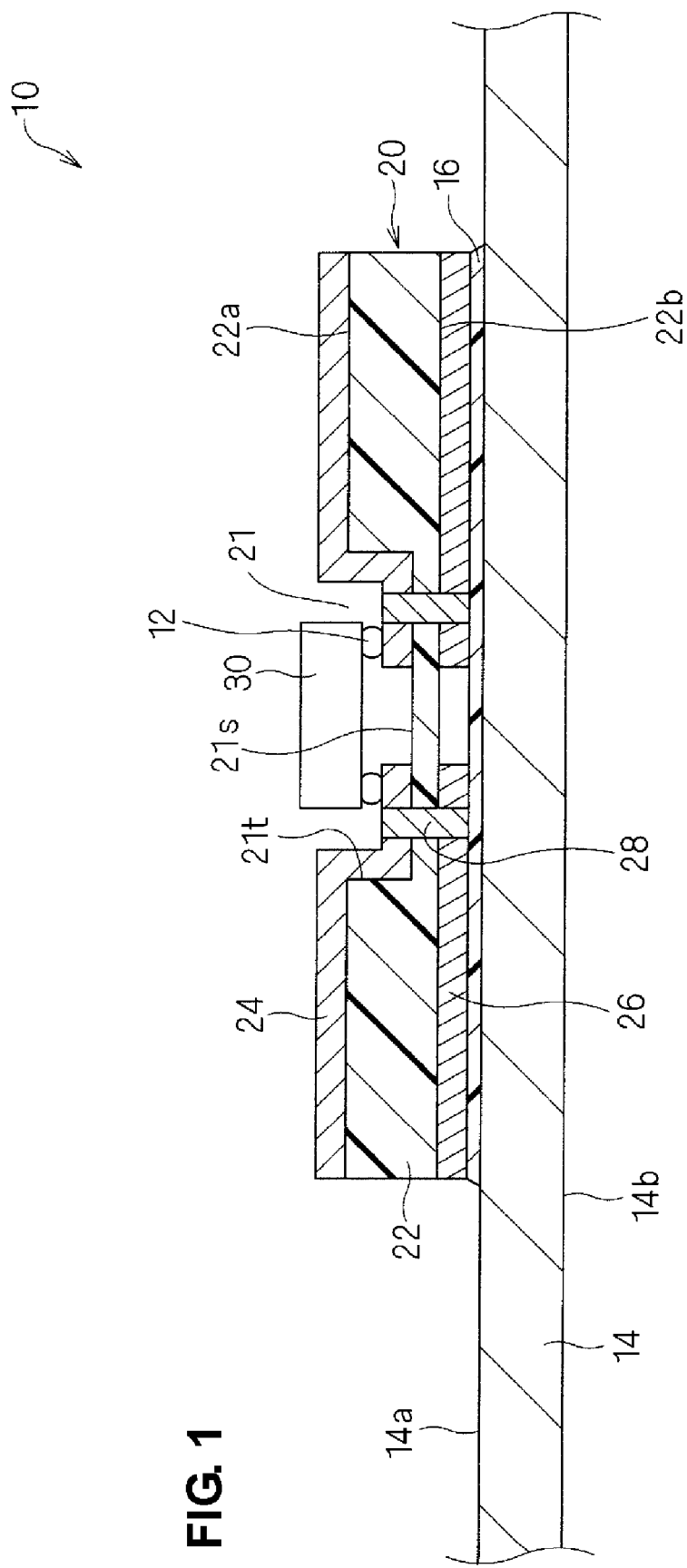
FIG. 1 is a sectional view of a wireless IC device according to a first preferred embodiment of the present invention.

As shown in a sectional view in FIG. 1, the wireless IC device 10 is preferably formed by bonding a module 20, in which a wireless IC chip 30 is mounted in a recess 21 of a substrate 22, to a radiation plate 14 using a bonding material 16, such as an insulating adhesive sheet (an adhesive thin film on the adhesive surface of a commercially available seal) or an adhesive, for example. The radiation plate 14 includes a conductive material that is arranged in a predetermined shape.

The radiation plate 14 may preferably be formed, for example, by printing a resin including Ag particles on a sheet-shaped base and forming small wiring thereon by inkjet or photolithography and the base having the radiation plate 14 formed thereon may be bonded to a commodity, such as a package or container, for example.

While the radiation plate 14 is electromagnetically coupled to the substrate 22 via the insulating bonding material 16, a direct current is not passed between the radiation plate 14 and the substrate 22. Specifically, the substrate 22 includes a coupling electrode, and the radiation plate 14 and the coupling electrode are electromagnetically coupled via an electromagnetic wave. Also, the radiation plate 14 and the coupling electrode may be electromagnetically coupled using only an electrical field or a magnetic field.

If the wireless IC device 10 is used in an RFID system, an outside reader/writer (not shown) communicates with the wireless IC chip 30 of the wireless IC device 10 bonded to a commodity via the radiation plate 14 so as to read data stored in the wireless IC chip 30 in a contactless manner.

The substrate 22 is preferably made of a resin material, for example. The recess 21 is provided in the substrate 22 by pressing the substrate 22. A wiring pattern 24 is provided along an upper surface 22$a$, which is a first main surface of the substrate 22, and an inner circumferential surface 21$t$ and a bottom surface 21$s$ of the recess 21. A wiring pattern 26 is provided along a lower surface 22$b$, which is a second main surface of the substrate 22.

Figure 3:
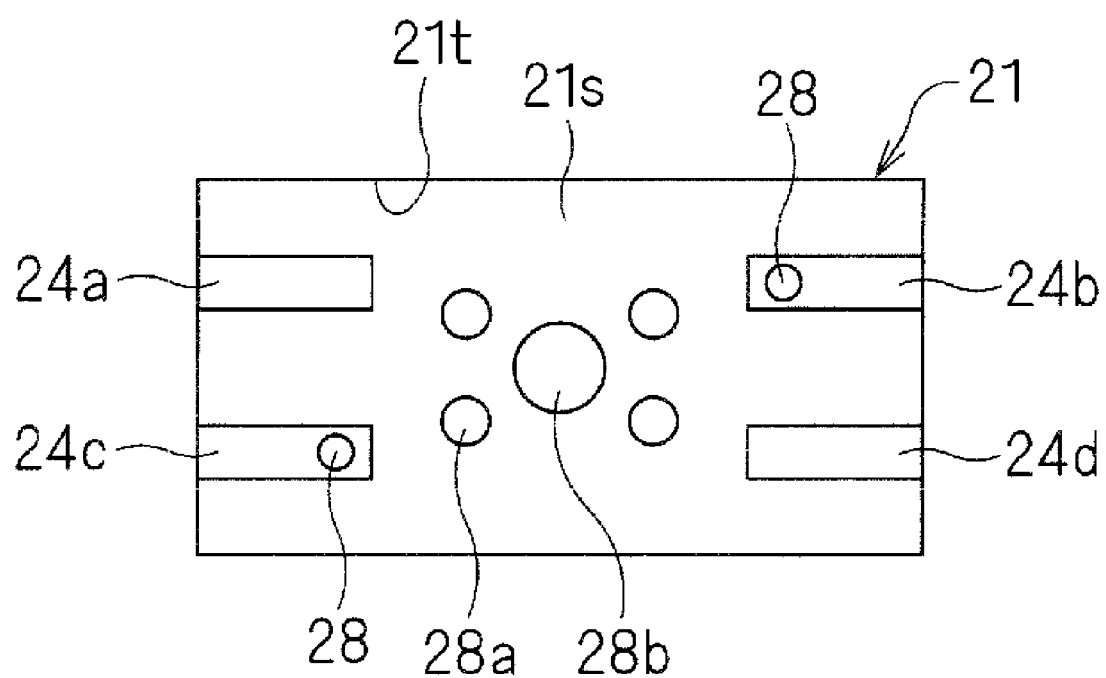
FIG. 3 is a plan view of the bottom of a recess according to the first preferred embodiment of the present invention.

FIG. 1 only shows through conductors 28 that pass between the bottom surface 21$s$ of the recess 21 and the lower surface 22$b$ of the substrate 22 and are connected to the wiring patterns 24 and 26. However, as shown in FIG. 3, which is a plan view in which the recess 21 is shown from above, the through conductors 28 are connected to two wiring patterns 24$b$ and 24$c$ of four wiring patterns 24$a$ to 24$d$ provided on the bottom surface 21$s$ of the recess 21. Also, through conductors 28$a$ and 28$b$ are provided at locations separate from the wiring patterns 24$a$ to 24$d$. The through conductors 28$a$ and 28$b$ are wedge members and extend between the bottom surface 21$s$ of the recess 21 and the lower surface 22$b$ of the substrate 22, similar to the through conductor 28 connected to the wiring patterns 24$b$ and 24$c$.

Figure 4:
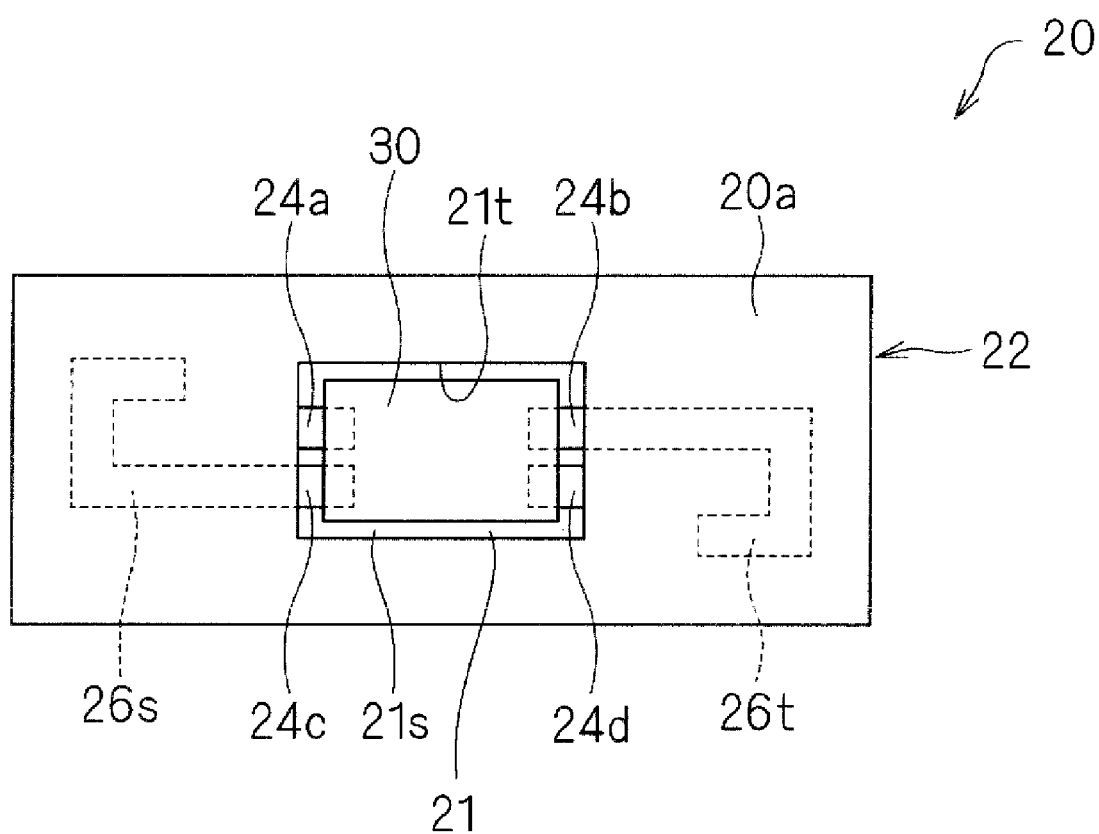
FIG. 4 is a plan view of the module according to the first preferred embodiment of the present invention.

In the module 20, as shown in a plan view in FIG. 4, the wireless IC chip 30 is mounted on the wiring patterns 24$a$ to 24$d$ provided on the bottom surface 21$s$ of the recess 21. The wireless IC chip 30 is preferably mounted on the wiring patterns with bumps 12 (see FIG. 1) therebetween by flip-chip bonding using an Au bump, an Ag bump, a solder bump, or other suitable bump material or Ag nano-bonding, for example. The wireless IC chip 30 may be mounted using mold bonding or wire bonding or using a combination of these bonding methods, for example. Also, an insulating material may preferably be disposed between a mount electrode of the wireless IC chip and the wiring patterns, and the mount electrode and the wiring patterns may be electromagnetically coupled using a capacitance or a magnetic field, for example.

An input/output terminal of the wireless IC chip 30 is connected to the wiring patterns 24$b$ and 24$c$ to which the through conductors 28 are connected. A dummy terminal of the wireless IC chip 30 is connected to the other wiring patterns 24$a$ and 24$d$. The wiring patterns 24$b$ and 24$c$ are electrically connected to feed circuits 26$s$ and 26$t$ defined by the wiring pattern 26 on the lower surface 22$b$ of the substrate 22 via the through conductors 28. Note that a portion of the wiring pattern 24 (see FIG. 1) provided on the upper surface 22a of the substrate 22 is not shown in FIG. 4.

If the recess 21 is formed by pressing the substrate 22, the substrate 22 may be return-deformed near the recess 21. The through conductors 28a and 28b extending between the bottom surface 21s of the recess 21 and the lower surface 22b of the substrate 22 prevent the substrate 22 from being return-deformed near the recess 21.

In order to prevent the substrate 22 from being return-deformed near the recess 21, the through conductors 28, 28a, and 28b are preferably made of a different material from that of the substrate 22. The through conductors 28a and 28b may preferably be made of a nonconductive material, for example, since these conductors are not used for electrical connection. However, if the same material as that used for the through conductors 28 is used, the through conductors 28a and 28b can be provided simultaneously with the through conductors 28. This simplifies the process to thereby reduce the manufacturing cost.

As shown in FIG. 3, the size of the through conductors 28, 28a, and 28b, is increased closer to the center of the recess 21 is decreased farther from the center thereof. In the substrate 22, the amount of processing deformation caused by a press is greater in an area closer to the center of the recess 21, and the amount of processing deformation caused by a press is less in an area farther away from the center thereof. Therefore, an area having an increased processing deformation amount tends to be return-deformed to a greater extent after the press. Therefore, a larger through conductor is provided in an area that will be return-deformed to a greater extent after the press so that return deformation is more effectively prevented. This allows efficient formation of the through conductors using substantially the same amount of material.

Depending on the type of material, the size or shape of the recess, processing conditions, and other factors, an area closer to the inner circumferential surface of the recess 21 may be return-deformed to a greater extent after the substrate 22 is pressed and an area closer to the center of the recess 21 may be return-deformed to a lesser extent after the press. In such cases, it is preferable to provide a larger through conductor in an area closer to the inner circumferential surface 21t of the recess 21 and to provide a smaller through conductor in an area closer to the center of the recess 21.

A portion of the wiring pattern 24 provided on the upper surface 22a of the substrate 22 and the wiring pattern 26 provided on the lower surface 22b of the substrate 22 define a feed circuit including an inductance element. The feed circuit includes a resonant circuit having a resonant frequency corresponding to the operating frequency of the wireless IC chip 30. The feed circuit may preferably include a matching circuit arranged to match the characteristic impedance of the radiation plate 14 with that of the wireless IC chip 30.

Next, steps for manufacturing the module 20 will be described with reference to FIGS. 2A to 2D and FIG. 3. FIGS. 2A to 2D are sectional views schematically showing the steps for manufacturing the module 20.

Figure 2A:
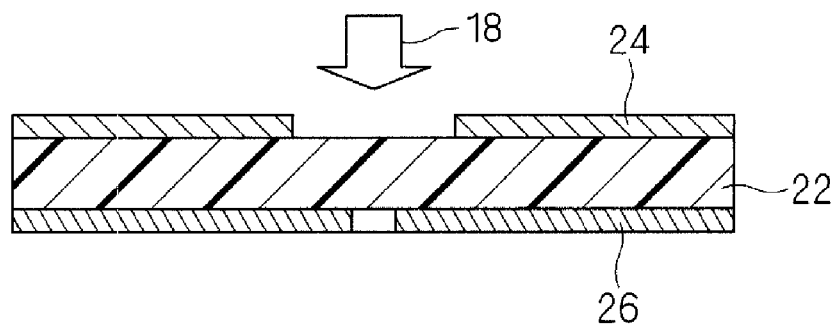
FIGS. 2A to 2D are sectional views showing steps for manufacturing a module according to the first preferred embodiment of the present invention.

First, as shown in FIG. 2A, a metal foil-attached resin sheet is prepared and the metal foil is processed into a predetermined pattern by etching or other suitable method. Thus, the wiring patterns 24 and 26 made of the metal foil are formed on both surfaces or on one surface of the substrate 22 made of the resin sheet. The wiring pattern 24 formed on the upper surface 22a of the substrate 22 is also formed in areas that will become the bottom surface 21s and inner circumferential surface 21t of the recess 21 by a press in a subsequent process step.

A material that is relatively easy to process and that is deformed to a lesser extent after being processed is suitable as the resin sheet substrate 22. For example, a resin sheet made of liquid crystal polymer (LCP), polyimide, or fluorocarbon resin is used as the substrate 22. A material, such as copper, for example, that can easily be processed into a wiring pattern is preferably used as the metal foil of the resin sheet.

Figure 2B:
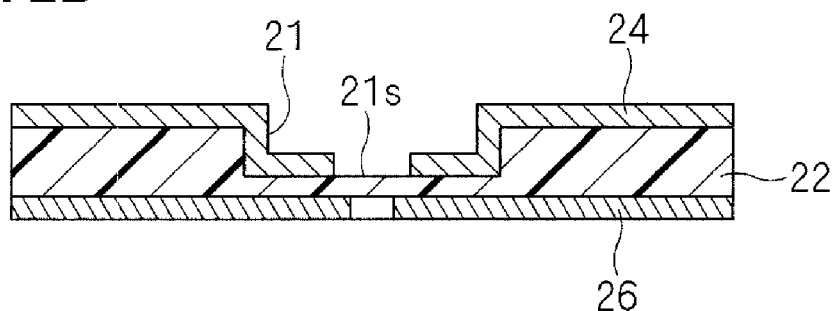

Next, by pressing the upper surface 22a of the resin sheet substrate 22 as shown by an arrow 18 in FIG. 2A, the recess 21 is formed as shown in FIG. 2B. Simultaneously, portions of the wiring pattern 24 formed in advance in the areas that will become the bottom surface 21s and inner circumferential surface 21t of the recess 21 are also pressed so that the portions are deformed into a shape extending along the bottom surface 21s and inner circumferential surface 21t of the recess 21. These portions also define a wiring electrode.

For example, the recess 21 is made preferably by pressing a convex mold having a protrusion corresponding to the size and shape of the recess 21 against the upper surface 22a of the resin sheet substrate 22. The substrate 22 may be heated as necessary and a recess may be formed by pressing the softened substrate 22. For example, a resin sheet is disposed on a hot plate and heated to about 300° C. and a recess is formed on the resin sheet using a mold.

Figure 2C:
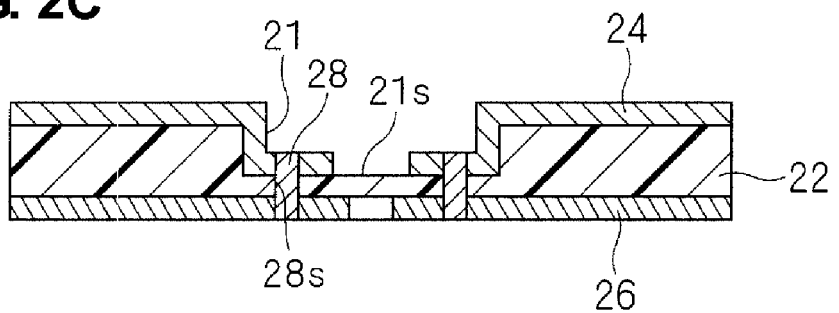

Next, as shown in FIG. 2C, through holes 28s passing between the bottom surface 21s of the recess 21 and the lower surface 22b of the substrate 22 are formed by laser processing, punching using a mold, or other suitable method. Subsequently, the through conductors 28 are formed preferably by filling the through holes 28s with a conductive material, such as a via paste, for example.

As shown in FIG. 3, at the same time that the through conductors 28 connected the wiring patterns 24b and 24c are formed, the through conductors 28a and 28b are formed at locations separate from the wiring patterns 24a to 24d. The through conductors 28a and 28b are wedge members.

The through holes 28s for forming the through conductors 28 and through holes for forming the through conductors 28a and 28b may be formed from the bottom surface 21s side of the recess 21 or from the lower surface 22b side of the resin sheet substrate 22.

Figure 2D:
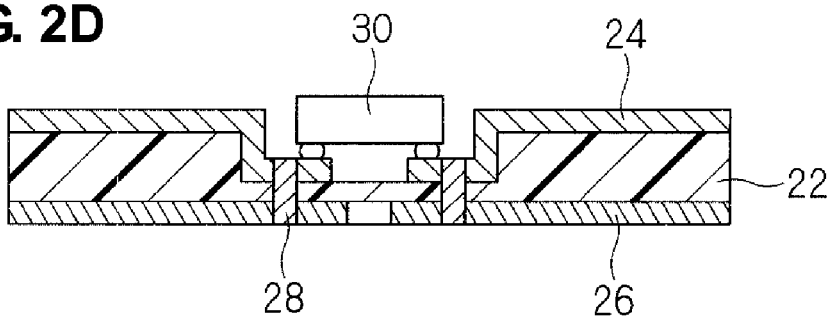

Next, as shown in FIG. 2D, the wireless IC chip 30 is mounted in the recess 21. That is, terminals of the wireless IC chip 30 are preferably electrically connected to portions of the wiring pattern 24 on the bottom surface 21s of the recess 21 via the solder bumps 12.

If multiple modules 20 are manufactured simultaneously, the resin sheet substrate 22 is cut into individual modules 20.

According to the above-described process, the recess 21 is easily formed by pressing the resin sheet substrate 22. As a result, the cost of the module 20 is reduced. In addition, the module 20 having a thickness approximately equal to that of the wireless IC chip 30 is manufactured. Therefore, the profile of the module 20 is advantageously reduced.

Also, the through conductors 28, 28a, and 28b extending between the lower surface 22b of the resin sheet substrate 22 and the bottom surface 21s of the recess 21 prevent deformation of portions close to the interface with the through conductors 28, 28a, and 28b, of the resin sheet substrate 22. This prevents return-deformation of portions close to the recess 21, of the substrate 22.

Second Preferred Embodiment

A wireless IC device according to a second preferred embodiment of the present invention will be described with reference to FIGS. 5A to 5D and FIG. 6.

The wireless IC device according to the second preferred embodiment has a configuration substantially the same as that of the wireless IC device according to the first preferred embodiment. The difference between the second preferred embodiment and first preferred embodiment will be described and the same reference numerals will be assigned to the same or similar elements.

The wireless IC device according to the second preferred embodiment is different from the first preferred embodiment in the order of the steps for manufacturing the module. Hereafter, the steps for manufacturing the module will be described with reference to sectional views in FIGS. 5A to 5D and a main portion plan view in FIG. 6.

Figure 5A:
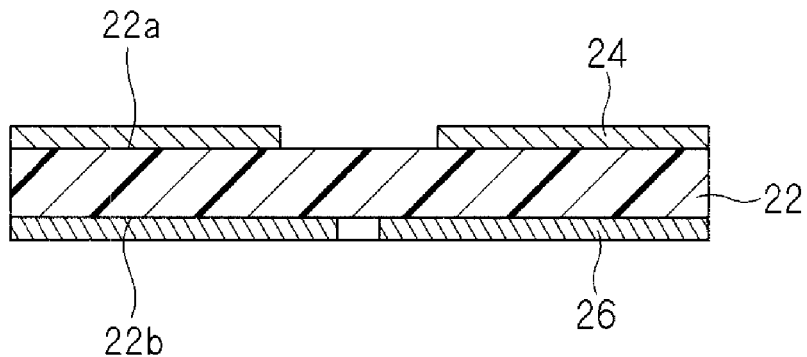
FIGS. 5A to 5D are sectional views showing steps for manufacturing a module according to a second preferred embodiment of the present invention.

First, as shown in FIG. 5A, a metal foil-attached resin sheet is prepared and the metal foil is processed into a predetermined pattern by etching or other suitable method. Thus, the wiring patterns 24 and 26 are formed on both or one of the surfaces 22a and 22b of the substrate 22 made of the resin sheet. The wiring pattern 24 formed on the upper surface 22a of the substrate 22 including in areas that will become the bottom surface 21s and inner circumferential surface 21t of the recess 21 by a press in a subsequent process.

A material that is relatively easy to process and that is deformed to a lesser extent after processed is suitable as the resin sheet substrate 22. For example, a resin sheet made of liquid crystal polymer (LCP), polyimide, or fluorocarbon resin, for example, is preferably used as the substrate 22. A material, such as copper, for example, that is easily processed into a wiring pattern is preferably used as the metal foil of the resin sheet.

Figure 5B:
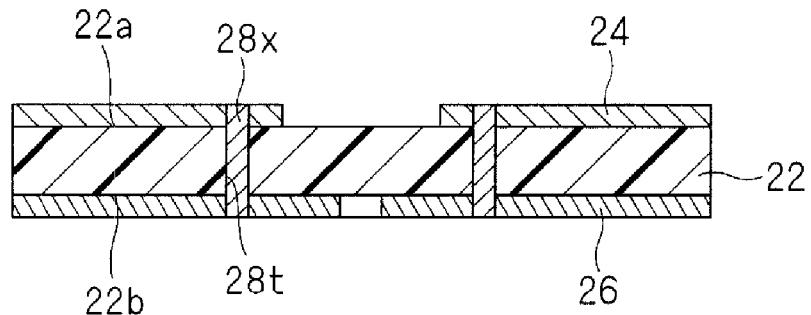

Next, as shown in FIG. 5B, through holes 28t passing through the surfaces 22a and 22b of the resin sheet substrate 22 are formed by laser processing, punching using a mold, or other suitable method. Then, through conductors 28x are formed by filling the through holes 28t with a conductive material such as a via paste, for example.

Figure 6:
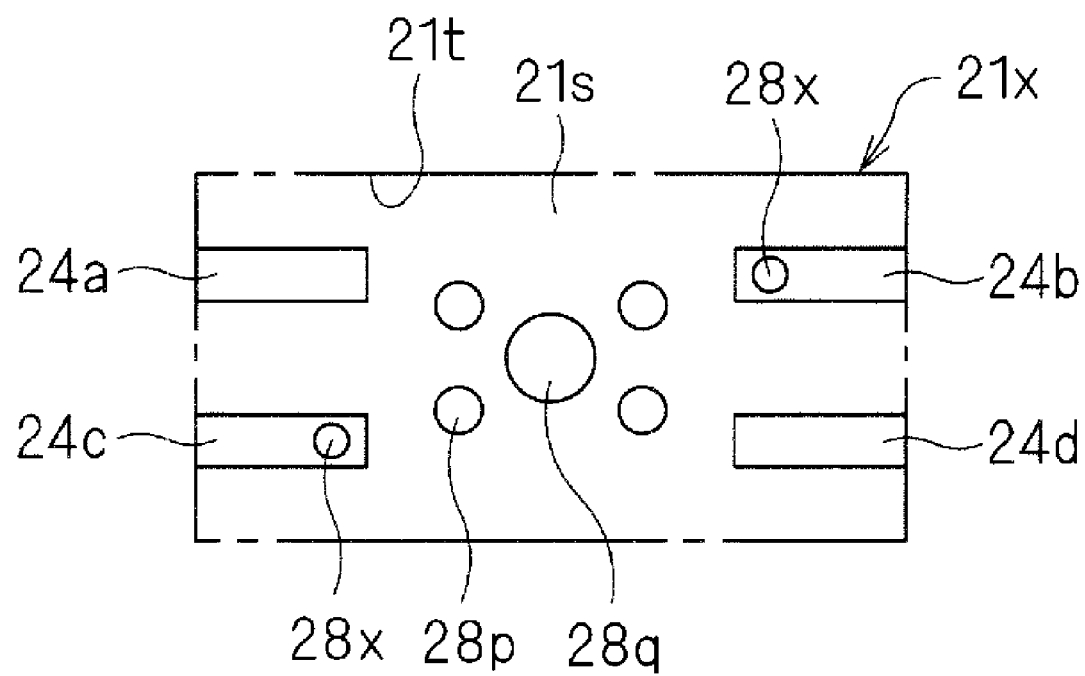
FIG. 6 is a plan view of an area that will become the bottom of a recess according to the second preferred embodiment of the present invention.

At that time, as shown in FIG. 6, the through conductors 28x are formed so that the through conductors 28x are connected to the two wiring patterns 24b and 24c of the wiring the patterns 24a to 24d formed in advance in an area 21x that will become the bottom surface 21s of the recess 21. Simultaneously, through conductors 28p and 28q are formed at locations separate from the wiring patterns 24a to 24d.

The through holes 28t arranged to form the through conductors 28x and through holes arranged to form the through conductors 28p and 28q may be formed to extend from the upper surface 22a side of the resin sheet substrate 22 or from the lower surface 22b side thereof.

Figure 5C:
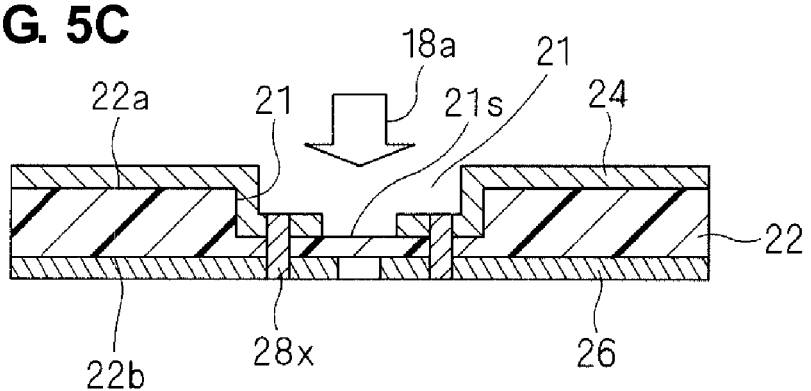

Next, by pressing the upper surface 22a of the resin sheet substrate 22 as shown by an arrow 18a in FIG. 5C, the recess 21 is formed. Simultaneously, portions of the wiring pattern 24 that are formed in advance in areas that will become the bottom surface 21s and inner circumferential surface 21t of the recess 21, are also pressed so that the portions are formed into a shape extending along the bottom surface 21s and inner circumferential surface 21t of the recess 21, and define a wiring electrode.

Simultaneously, the through conductors 28x, 28p, and 28q (see FIG. 6) are also pressed and deformed so that the conductors 28x 28p, and 28q extend between the bottom surface 21s of the recess 21 and the lower surface 22b of the substrate 22. The through conductors 28p and 28q are wedge members and are separate from the wiring pattern 24 (24a to 24d).

The recess 21 is preferably formed, for example, by pressing a convex mold having a protrusion corresponding to the size and shape of the recess 21 against the upper surface 22a of the resin sheet substrate 22. The substrate 22 may be heated and a recess may be formed by pressing the softened substrate 22. For example, a resin sheet is disposed on a hot plate and a mold is pressed against the resin sheet.

Figure 5D:
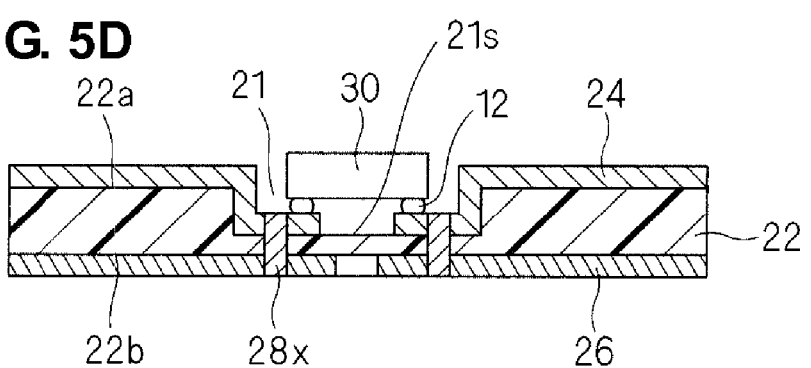

Next, as shown in FIG. 5D, the wireless IC chip 30 is mounted in the recess 21. Specifically, terminals of the wireless IC chip 30 are preferably electrically connected to portions of the wiring pattern 24 formed on the bottom surface 21s of the recess 21 via the bumps 12, for example.

If multiple modules 20 are manufactured simultaneously, the resin sheet substrate 22 is cut into individual modules 20.

By performing the above-described process, the through conductors 28x, 28p, and 28q are hardened while the recess 21 is formed. Thus, the height of the recess 21 is stabilized.

Also, as in the first preferred embodiment, the recess 21 is easily formed by pressing the resin sheet substrate 22. As a result, the cost of the module 20 is reduced. Also, the module 20 having a thickness approximately the same as that of the wireless IC chip 30 is manufactured. Therefore, the profile of the module 20 is reduced.

In addition, the wiring pattern 24 is easily formed on the inner circumferential surface 21t and bottom surface 21s of the recess 21. Thus, the length of the wiring between the wireless IC chip 30 mounted on the recess 21 and the upper surface 22a of the substrate 22 is as short as possible. As a result, the wiring is not routed through a detour on the lower surface 22b of the substrate 22. That is, electrical properties are not degraded due to the occurrence of an unnecessary inductor component or capacitor component in the detour portion of the wiring, and thus, the manufacturing cost is increased.

Also, the through conductors 28x, 28p, and 28q extending between the lower surface 22b of the resin sheet substrate 22 and the bottom surface 21s of the recess 21 prevent deformation of portions close to the interface with the through conductors 28x, 28p, and 28q, of the resin sheet substrate 22. This prevents return-deformation of the substrate 22 near the recess 21.

Third Preferred Embodiment

A wireless IC device according to a third preferred embodiment of the present invention will be described with reference to FIGS. 7A to 7D and FIG. 8.

The wireless IC device according to the third preferred embodiment has a configuration substantially the same as that of the wireless IC device according to the first preferred embodiment. The wireless IC device according to the third preferred embodiment is different from the first preferred embodiment in the order of the steps for manufacturing the module 20. Hereafter, the steps for manufacturing the module 20 will be described with reference to a sectional views in FIGS. 7A to 7D and a main portion plan view shown in FIG. 8.

Figure 7A:
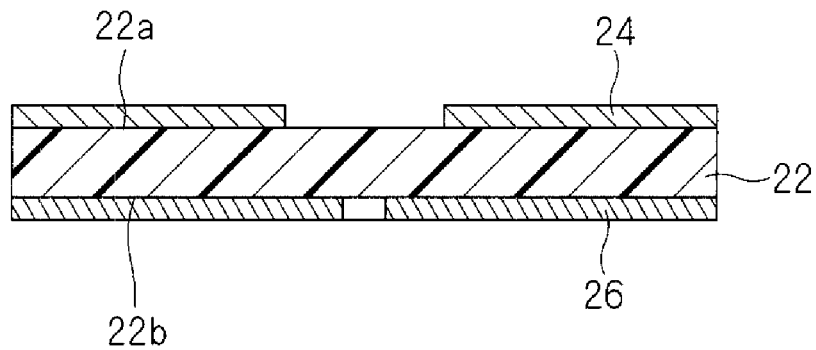
FIGS. 7A to 7D are sectional views showing steps for manufacturing a module according to a third preferred embodiment of the present invention.

First, as shown in FIG. 7A, a metal foil-attached resin sheet is prepared and the metal foil is processed into a predetermined pattern by etching or other suitable method. Thus, the wiring patterns 24 and 26 are formed on both or one of the surfaces 22a and 22b of the resin sheet substrate 22. A material that is easy to process and is deformed to a lesser extent after processed is suitable as the resin sheet substrate 22. For example, a resin sheet made of liquid crystal polymer (LCP), polyimide, or fluorocarbon resin, for example, is preferably used as the substrate 22. A material, such as copper, for example, that is easily processed into a wiring pattern is preferably used as the metal foil of the resin sheet.

Figure 7B:
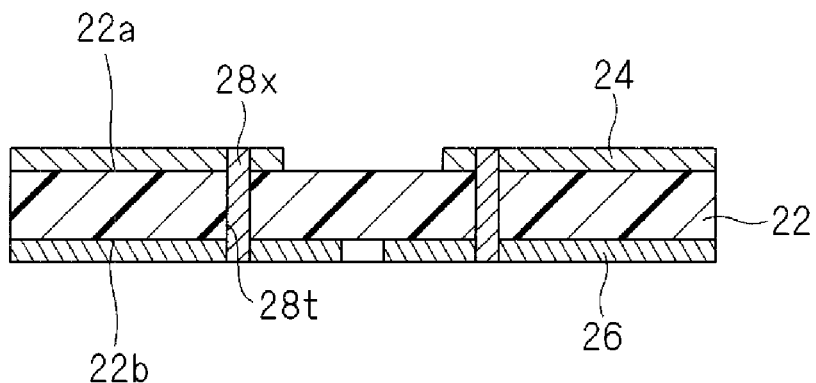

Next, as shown in FIG. 7B, the through holes 28t passing between the surfaces 22a and 22b of the resin sheet substrate 22 are formed by laser processing, punching using a mold, or other suitable method. Then, the through conductors 28x are formed by filling the through holes 28t with a conductive material such as a via paste, for example.

Figure 8:
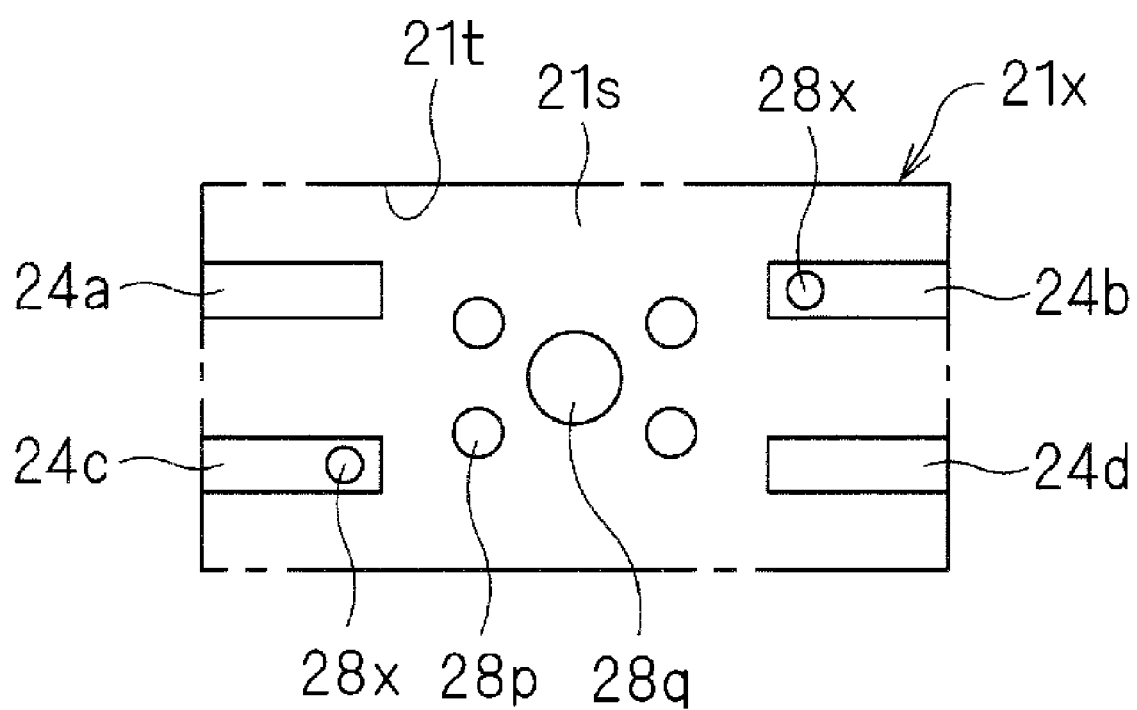
FIG. 8 is a plan view of an area that will become the bottom of a recess according to the third preferred embodiment of the present invention.

At that time, as shown in FIG. 8, the through conductors 28x are formed so that the through conductors 28x are connected to the two wiring patterns 24b and 24c of the wiring patterns 24a to 24d formed in advance in the area 21x that will become the bottom surface 21s of the recess 21. Simultaneously, the through conductors 28p and 28q are formed at locations separate from the wiring patterns 24a to 24d.

The through holes 28t arranged to form the through conductors 28x and through holes arranged to form the through conductors 28p and 28q may preferably be formed from the upper surface 22a side of the resin sheet substrate 22 or from the lower surface 22b side thereof.

Figure 7C:
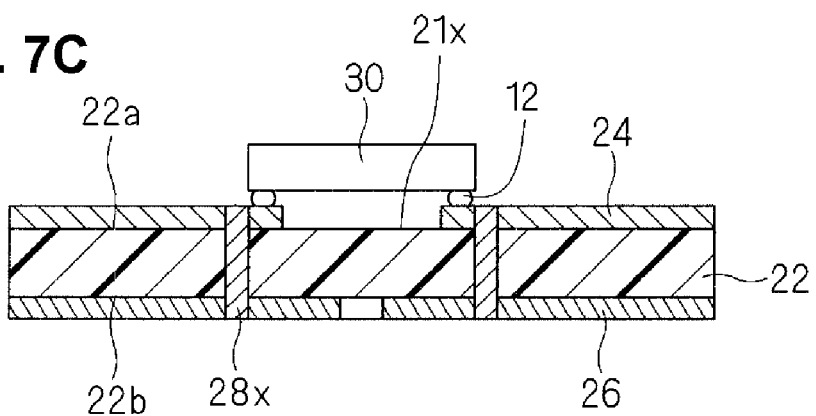
Figure 7D:
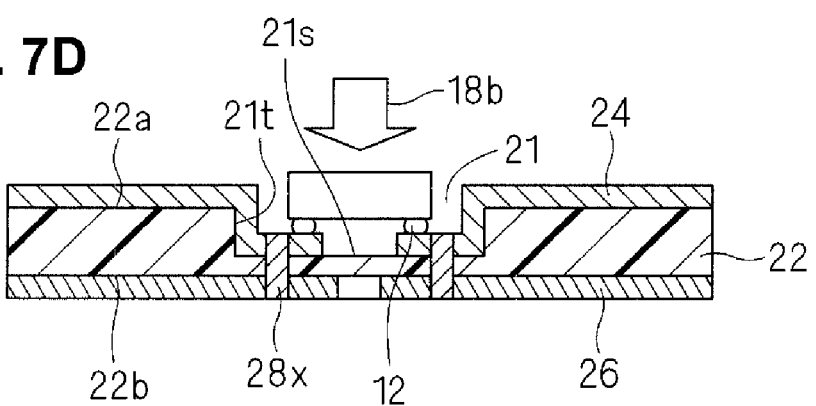

Next, as shown in FIG. 7C, the wireless IC chip 30 is disposed in an area that will become the bottom surface 21s of the recess 21. Specifically, the wireless IC chip 30 is disposed on the wiring pattern 24 in the area that will become the bottom surface 21s of the recess 21 with the bumps 12 made of a conductive paste therebetween. Then, as shown by an arrow 18b in FIG. 7D, by pressing the wireless IC chip 30 disposed on the upper surface 22a of the resin sheet substrate 22 using a flat plate, the recess 21 is formed in the resin sheet substrate 22. Simultaneously, the wireless IC chip 30 is embedded in the recess 21.

At this time, portions of the wiring pattern formed in advance in areas that will become the bottom surface 21s and inner circumferential surface 21t of the recess 21 are also pressed so that the portions are formed into a shape extending along the bottom surface 21s and inner circumferential surface 21t of the recess 21, and define a wiring electrode.

In addition, the through conductors 28x, 28p, and 28q (see FIG. 8) are pressed and deformed so that the through conductors 28x, 28p, and 28q extend between the bottom surface 21s of the recess 21 and the lower surface 22b of the substrate 22. The through conductors 28p and 28q are wedge members and are separate from the wiring pattern 24 (24a to 24d).

By raising the temperature of the resin sheet substrate 22 at the time of the press, for example, by placing the substrate 22 on a hot plate, so that the via paste forming the through conductors 28x and the bumps 12 (conductive paste, etc.) for mounting the wireless IC chip 30 are hardened, the processes of forming the recess 21 and mounting the wireless IC chip 30 are simultaneously completed.

If multiple modules 20 are manufactured simultaneously, the resin sheet substrate 22 is cut into individual modules 20.

By performing the above-described process, the bumps arranged to mount the wireless IC chip 30 are formed and the via paste filling the through holes 28t are hardened while the recess 21 is formed. This enables forming the recess 21 having a stable depth and mounting the wireless IC chip 30 in one process step.

Also, as in the first preferred embodiment, the recess 21 is easily formed by pressing the resin sheet substrate 22. As a result, the cost of the module 20 is reduced. In addition, the module 20 having a thickness approximately equal to that of the wireless IC chip 30 is manufactured. Therefore, the profile of the module 20 is reduced.

Also, the wiring pattern 24 is easily formed on the inner circumferential surface 21t and bottom surface 21s of the recess 21. Thus, the length of the wiring between the wireless IC chip 30 mounted on the recess 21 and the upper surface 22a of the substrate 22 is as short as possible. As a result, the wiring is not routed through a detour on the lower surface 22b of the substrate 22. That is, the electrical properties are not degraded due to the occurrence of an unnecessary inductor component or capacitor component in the detour portion of the wiring, and thus, the manufacturing cost is increased.

Also, the through conductors 28x, 28p, and 28q extending between the lower surface 22b of the resin sheet substrate 22 and the bottom surface 21s of the recess 21 prevent deformation of portions close to the interface with the through conductors 28x, 28p, and 28q, of the resin sheet substrate 22. This prevents return-deformation of the substrate 22 near the recess 21.

Fourth Preferred Embodiment

An wireless IC device according to a fourth preferred embodiment of the present invention will be described with reference to FIGS. 9 and 10.

The wireless IC device according to the fourth preferred embodiment is different from the first preferred embodiment in that the substrate is a multilayer resin substrate.

Figure 9:
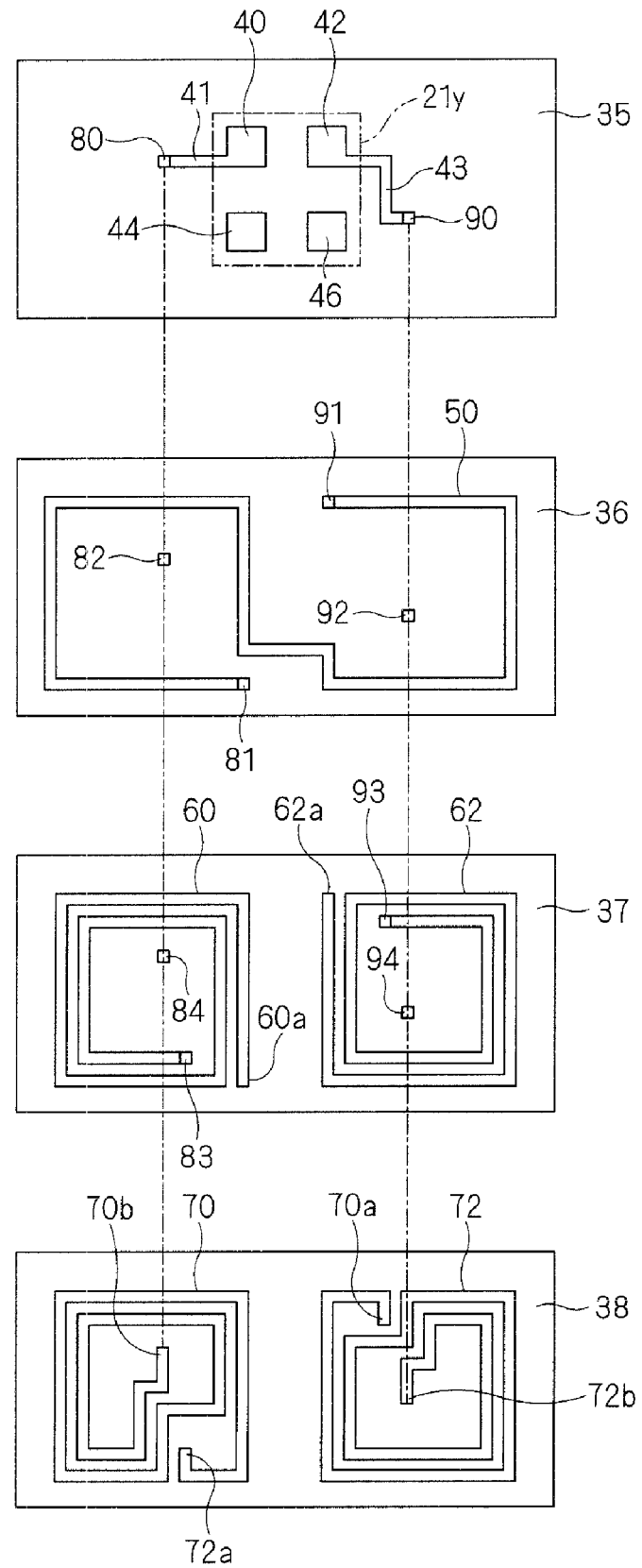
FIG. 9 is a diagram showing a configuration of a substrate according to a fourth preferred embodiment of the present invention.

As shown in an exploded plan view in FIG. 9, the substrate of the wireless IC device according to the fourth preferred embodiment is formed by sequentially laminating four resin substrates 35 to 38, for example.

On the upper surface of the resin substrate 35, electrodes 40, 42, 44, and 46 arranged to mount a wireless IC chip and wiring patterns 41 and 43, ends of which are connected to the mount electrodes 40 and 42, are formed. In addition, through holes 80 and 90 are provided at the other ends of the wiring patterns 41 and 43 on the resin substrate 35.

On the upper surface of the resin substrate 36, an approximately S-shaped wiring pattern 50 is provided. Also, on the resin substrate 36, through holes 81 and 91 are provided at both ends of the wiring pattern 50 and through holes 82 and 92 are arranged so as to be spaced apart from the wiring pattern 50.

On the upper surface of the resin substrate 36, two spiral wiring patterns 60 and 62 are provided. Also, on the resin substrate 36, through holes 83 and 93 are provided at ends of the wiring patterns 60 and 62, respectively, and through holes 84 and 94 are arranged so as to be spaced apart from the wiring patterns 60 and 62.

On the upper surface of the resin substrate 38, two spiral wiring patterns 70 and 72 are provided.

After the through holes 80 to 84 and 90 to 94 are filled with a via paste, the resin substrates 35 to 38 are laminated. Then, through conductors are formed in the through holes 80 to 84 and 90 to 94.

When the resin substrates 35 and 38 are laminated, the through holes 80, 82, and 84 communicate with one another. The through conductors formed in the through holes 80, 82, and 84 electrically connect the other ends of the wiring patterns 41 and 43 on the resin substrate 35, and ends 70a and 72a of the wiring patterns 70 and 72 on the resin substrate 38.

The other ends 70b and 72b of the wiring patterns 70 and 72 on the resin substrate 38 are connected to ends of the wiring patterns 60 and 62 provided on the resin substrate 37 via the through conductors formed in the through holes 83 and 93 of the resin substrate 37.

The other ends 60a and 62a of the wiring patterns 60 and 62 provided on the resin substrate 37 are connected to both ends of the wiring pattern 50 provided on the resin substrate 36 via the through conductors formed in the through holes 81 and 91 of the resin substrate 36.

Figure 10:
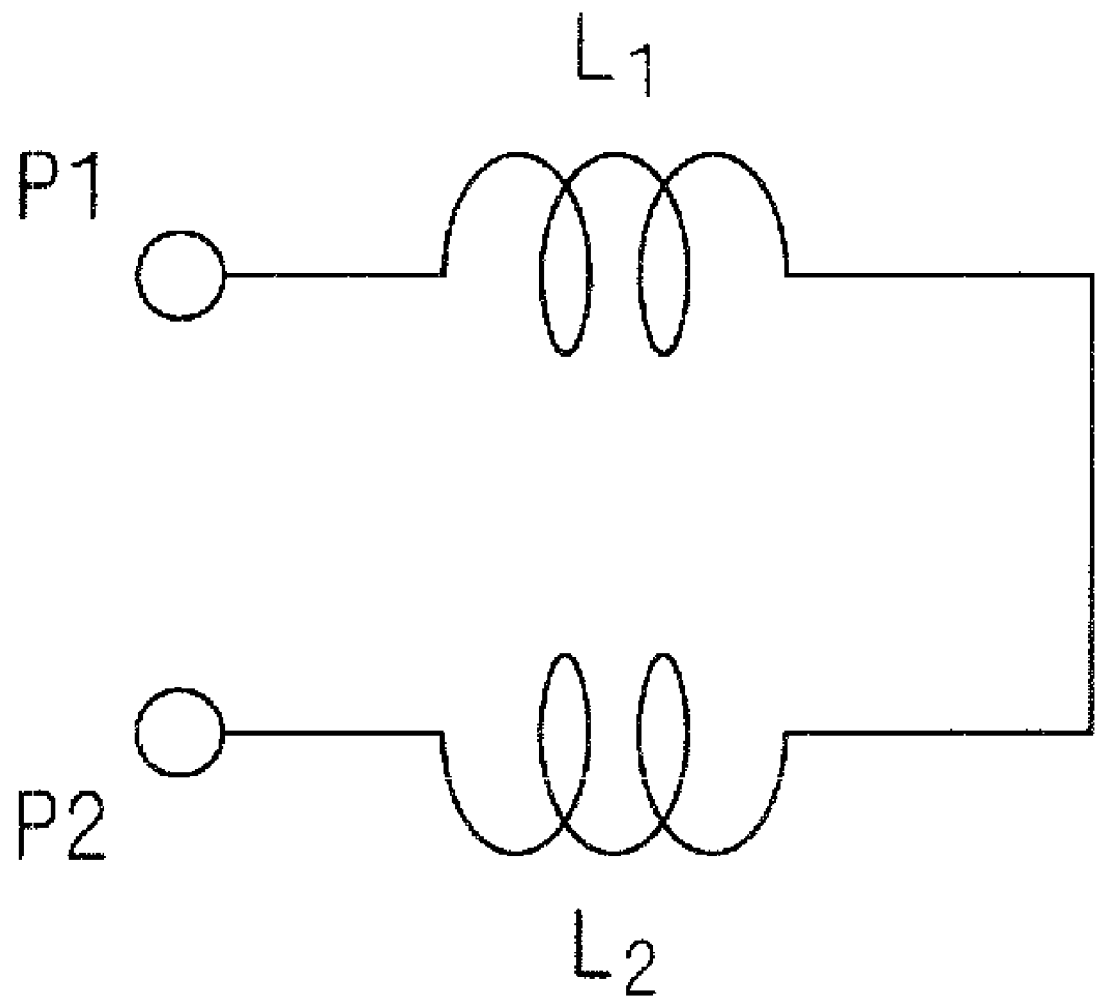
FIG. 10 is a diagram showing an electrical circuit formed in the substrate according to the fourth preferred embodiment of the present invention.

FIG. 10 is a diagram showing an electrical circuit provided in the substrate by laminating the resin substrates 35 to 38. Two inductance elements $L_1$ and $L_2$ are connected in series between terminals P1 and P2 corresponding to the mount substrates 40 and 42. The inductance $L_1$ is defined by the wiring patterns 50, 60, and 70 on the left hand side of FIG. 9. The inductance $L_2$ is defined by the wiring patterns 50, 62, and 72 on the right hand side of FIG. 9.

On the substrate including the laminated resin substrates 35 to 38, a recess is formed by pressing an area 21y that is shown by a chain line in FIG. 9 and that includes the mount electrodes 40, 42, 44, and 46. Then, a wireless IC chip is mounted on the mount electrodes 40, 42, 44, and 46.

Alternatively, on the substrate including the laminated resin substrates 35 to 38, a recess is formed by disposing a wireless IC chip on the mount electrodes 40, 42, 44, and 46 and then pressing the wireless IC chip using a flat plate. Thus, the wireless IC chip is embedded in the recess.

By forming a recess by pressing a multilayer resin substrate, the manufacturing cost is reduced. In addition, by using the wiring patterns 41 and 43 provided on the upper surface of the resin substrate 35, the length of the wiring routed between the wireless IC chip mounted in the recess and the upper surface of the multilayer resin substrate is reduced as much as possible. This prevents the routed wiring from degrading the electrical properties.

Modification 1

A wireless IC device 11 according to a modification of a preferred embodiment of the present invention will be described with reference to a sectional view in FIG. 11.

Figure 11:
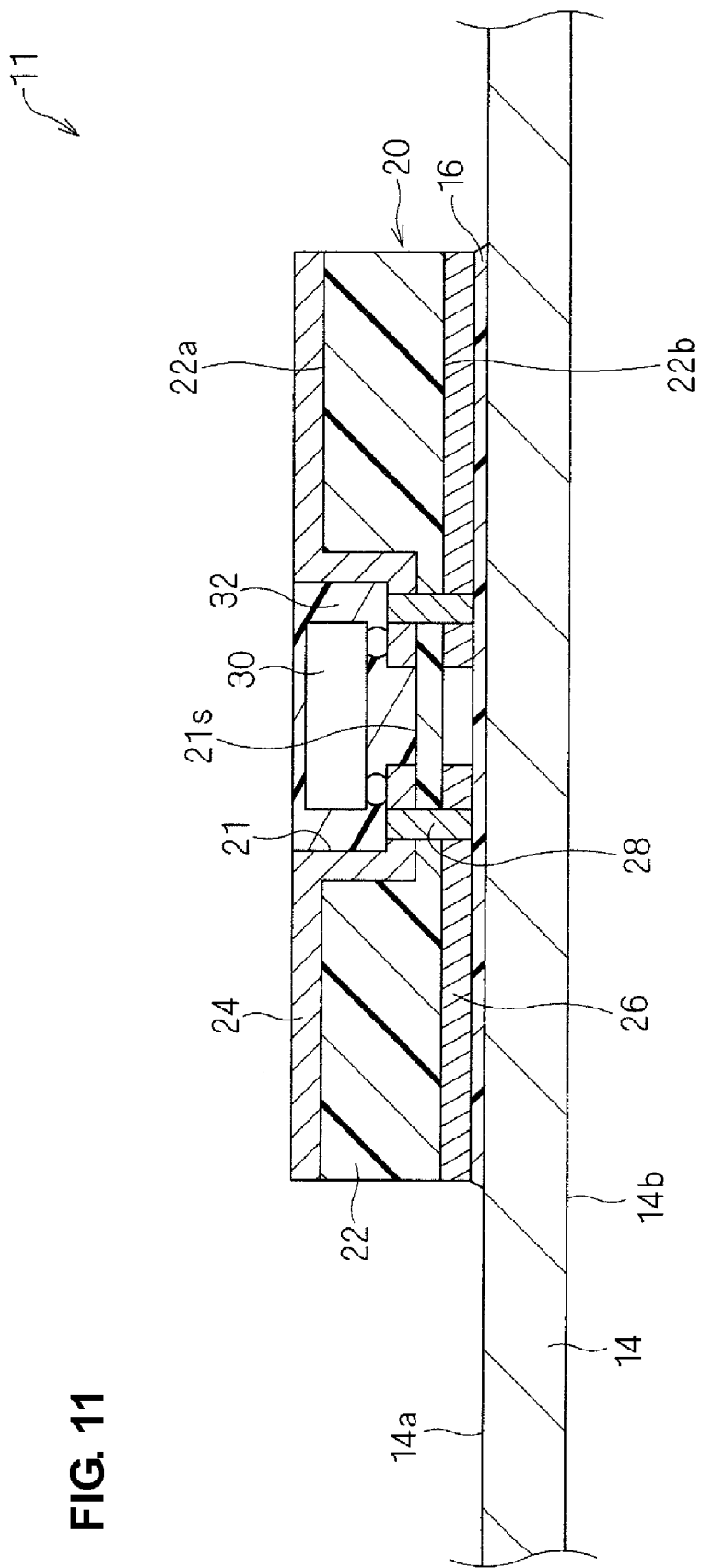
FIG. 11 is a sectional view of a wireless IC device according to a modification of a preferred embodiment of the present invention.
Figure 12A:
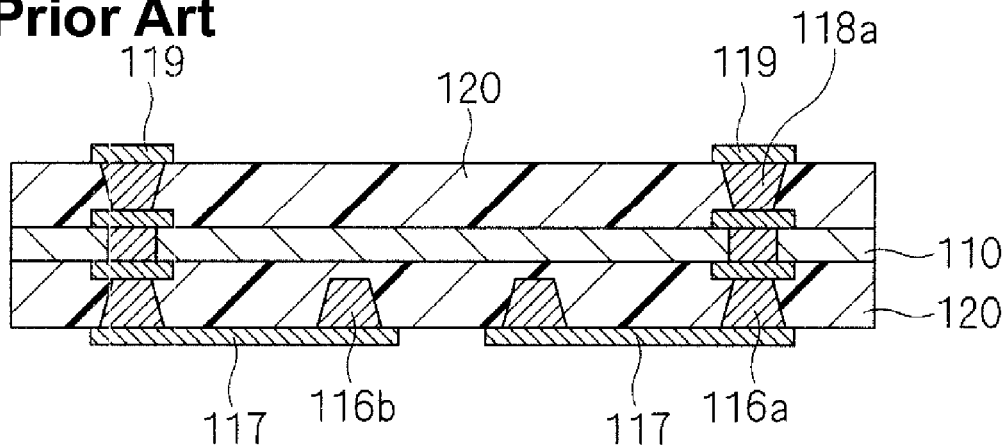
FIGS. 12A to 12C are sectional views showing steps for manufacturing a semiconductor apparatus according to the related art.
Figure 12B:
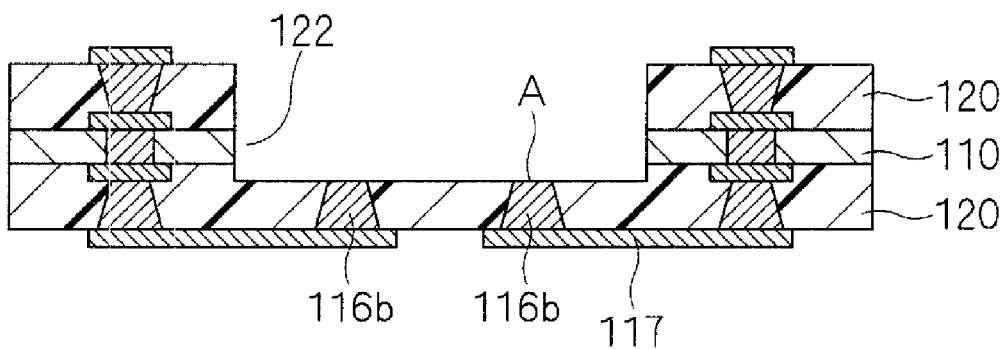
Figure 12C:
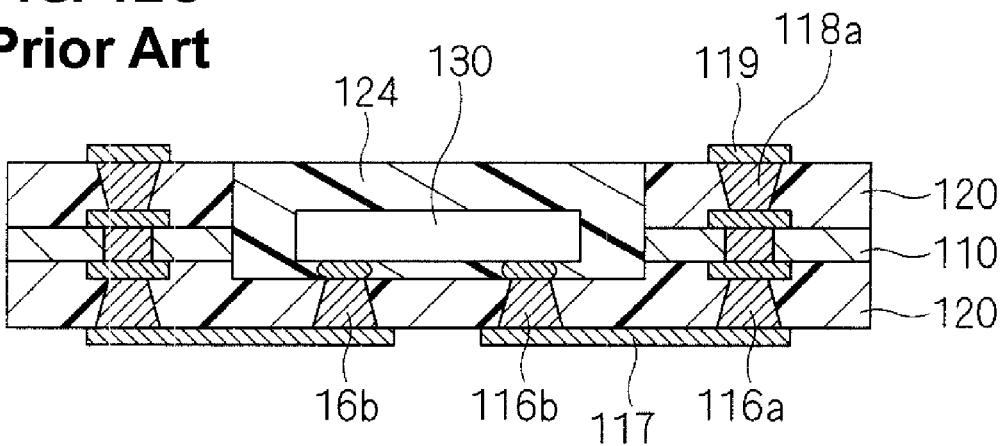

As shown in FIG. 11, the wireless IC device 11 according to the modification includes a protection film 32 in addition to the configuration of the first preferred embodiment. Specifically, the protection film 32 arranged to cover the wireless IC chip 30 mounted in the recess 21 is formed by filling the recess 21 with a resin.

Since the wireless IC chip 30 is protected from external moisture, toxic gases, and other contaminants by the protection film 32, the reliability of the wireless IC device 11 is further enhanced.

As is understood from the description above, by forming the recess by pressing the resin substrate, the manufacturing cost of the wireless IC device is reduced. In addition, since the length of the wiring connecting between the wireless IC chip mounted in the recess and the upper surface of the substrate is reduced as much as possible, degradation of the electrical properties is prevented.

The present invention is not limited to the above-described preferred embodiments and various changes can be made thereto.

For example, each through conductor (wedge member) may include sections having a uniform size or may include sections having different sizes. Each through conductor (wedge member) may have a wedge shape in which a section at one end is the largest and a second at the other end is the smallest.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A wireless IC device comprising:
    a radiation plate;
    a wireless IC chip; and
    a substrate on which the wireless IC chip is mounted, the substrate being provided with a feed circuit, the feed circuit including at least one of a resonant circuit or a matching circuit, the at least one of the resonant circuit or the matching circuit including an inductance element, the feed circuit being electromagnetically coupled to the radiation plate; wherein
    the substrate is made of a resin material and includes a recess in a first main surface thereof;
    the substrate is provided with a wiring electrode arranged along a bottom surface and an inner circumferential surface of the recess and on the first main surface of the substrate, the wiring electrode being electrically connected to the feed circuit;
    the substrate is provided with a wedge member made of a different material from that of the resin material, the wedge member extending between the bottom surface of the recess and a second main surface of the substrate so as to be spaced apart from the wiring electrode;
    the wireless IC chip is mounted in the recess and coupled to the wiring electrode; and
    the wedge member is arranged to prevent return-deformation of portions of the substrate close to the recess.

2. The wireless IC device according to claim 1, wherein the wedge member is defined by a through hole passing through the substrate that is filled with a conductive material.

3. The wireless IC device according to claim 1, wherein the feed circuit is provided on at least one of the first main surface of the substrate or the second main surface thereof.

4. The wireless IC device according to claim 1, wherein the wireless IC chip is arranged such that the entire wireless IC chip is closer to the bottom surface of the recess than to an opening of the recess, the opening being provided in the first main surface of the substrate.

5. The wireless IC device according to claim 1, wherein
    a plurality of the wedge members are provided and have different sizes; and
    a size of a first wedge member of the plurality of wedge members that is disposed close to a center of the bottom surface of the recess is larger than a size of a second wedge member of the plurality of wedge members that is disposed farther from the center of the bottom surface of the recess.

6. The wireless IC device according to claim 1, further comprising a protection film arranged to cover the wireless IC chip mounted in the recess.

7. A method for manufacturing a wireless IC device including a radiation plate, a wireless IC chip, and a substrate on which the wireless IC chip is mounted, the substrate being provided with a feed circuit, the feed circuit including at least one of a resonant circuit or a matching circuit, the at least one of the resonant circuit or the matching circuit including an inductance element, the feed circuit being electromagnetically coupled to the radiation plate, the method comprising the steps of:
    forming a recess in the substrate made of a resin material by pressing a portion of a first main surface of the substrate and a portion of a wiring electrode, so that the wiring electrode extends along a bottom surface and an inner circumferential surface of the recess, the wiring electrode being formed in advance on the first main surface of the substrate and connected to the feed circuit;
    forming a wedge member using a different material from the resin material such that the wedge member extends between the bottom surface of the recess and a second main surface of the substrate spaced apart from the wiring electrode; and
    mounting the wireless IC chip in the recess so as to couple the wireless IC chip to the wiring electrode; wherein
    the wedge member is arranged to prevent return-deformation of portions of the substrate close to the recess.

8. A method for manufacturing a wireless IC device including a radiation plate, a wireless IC chip, and a substrate on which the wireless IC chip is mounted, the substrate being provided with a feed circuit, the feed circuit including at least one of a resonant circuit or a matching circuit, the at least one of the resonant circuit or the matching circuit including an inductance element, the feed circuit being electromagnetically coupled to the radiation plate, the method comprising the steps of:

forming a wedge member such that the wedge member extends between a first main surface of the substrate made of a resin material and a second main surface thereof spaced apart from a wiring electrode, the wiring electrode being formed in advance on the first main surface of the substrate and connected to the feed circuit, using a different material from the resin material;

forming a recess in the substrate by pressing a portion of the first main surface of the substrate, a portion of the wiring electrode, and the wedge member, so that the wiring electrode extends along a bottom surface and an inner circumferential surface of the recess and so that the wedge member extends between the bottom surface of the recess and the second main surface of the substrate; and mounting the wireless IC chip in the recess so as to couple the wireless IC chip to the wiring electrode; wherein the wedge member is arranged to prevent return-deformation of portions of the substrate close to the recess.

9. A method for manufacturing a wireless IC device including a radiation plate, a wireless IC chip, and a substrate on which the wireless IC chip is mounted, the substrate being provided with a feed circuit, the feed circuit including at least one of a resonant circuit or a matching circuit, the at least one of the resonant circuit or the matching circuit including an inductance element, the feed circuit being electromagnetically coupled to the radiation plate, the method comprising the steps of:

forming a wedge member such that the wedge member extends between a first main surface of the substrate made of a resin material and a second main surface thereof spaced apart from a wiring electrode, using a different material different from the resin material, the wiring electrode being formed in advance on the first main surface of the substrate and connected to the feed circuit; and forming a recess, in which the wireless IC chip is to be embedded, on the substrate by pressing the wireless IC chip against the first main surface of the substrate in a state in which the wireless IC chip is mounted on the first main surface of the substrate such that the wireless IC chip is opposed to the wiring electrode on the substrate, so that the wiring electrode extends along a bottom surface and an inner circumferential surface of the recess, and so that the wedge member extends between the bottom surface of the recess and the second main surface of the substrate; wherein the wedge member is arranged to prevent return-deformation of portions of the substrate close to the recess.

10. A wireless IC device comprising:

a radiation plate;

a wireless IC chip; and a substrate on which the wireless IC chip is mounted, the substrate being provided with a feed circuit, the feed circuit including at least one of a resonant circuit or a matching circuit, the at least one of the resonant circuit or the matching circuit including an inductance element, the feed circuit being electromagnetically coupled to the radiation plate; wherein the substrate is made of a resin material and includes a recess in a first main surface thereof;

the substrate is provided with a wiring electrode arranged along a bottom surface of the recess and on the first main surface of the substrate, the wiring electrode being electrically connected to the feed circuit;

the substrate is provided with a wedge member made of a different material from that of the resin material, the wedge member extending between the bottom surface of the recess and a second main surface of the substrate so as to be spaced apart from the wiring electrode;

the wireless IC chip is mounted in the recess and coupled to the wiring electrode; and the wedge member is arranged to prevent return-deformation of portions of the substrate close to the recess.

11. The wireless IC device according to claim 10, wherein the wedge member is defined by a through hole passing through the substrate that is filled with a conductive material.

12. The wireless IC device according to claim 10, wherein the feed circuit is provided on at least one of the first main surface of the substrate or the second main surface thereof.

13. The wireless IC device according to claim 10, wherein the wireless IC chip is arranged such that the entire wireless IC chip is closer to the bottom surface of the recess than to an opening of the recess, the opening being provided in the first main surface of the substrate.

14. The wireless IC device according to claim 10, wherein a plurality of the wedge members are provided and have different sizes; and a size of a first wedge member of the plurality of wedge members that is disposed close to a center of the bottom surface of the recess is larger than a size of a second wedge member of the plurality of wedge members that is disposed farther from the center of the bottom surface of the recess.

15. The wireless IC device according to claim 10, further comprising a protection film arranged to cover the wireless IC chip mounted in the recess.

16. A method for manufacturing a wireless IC device including a radiation plate, a wireless IC chip, and a substrate on which the wireless IC chip is mounted, the substrate being provided with a feed circuit, the feed circuit including at least one of a resonant circuit or a matching circuit, the at least one of the resonant circuit or the matching circuit including an inductance element, the feed circuit being electromagnetically coupled to the radiation plate, the method comprising the steps of:

forming a recess in the substrate made of a resin material by pressing a portion of a first main surface of the substrate and a portion of a wiring electrode, so that the wiring electrode extends along a bottom surface of the recess, the wiring electrode being formed in advance on the first main surface of the substrate and connected to the feed circuit;

forming a wedge member using a different material from the resin material such that the wedge member extends between the bottom surface of the recess and a second main surface of the substrate spaced apart from the wiring electrode; and mounting the wireless IC chip in the recess so as to couple the wireless IC chip to the wiring electrode; wherein the wedge member is arranged to prevent return-deformation of portions of the substrate close to the recess.

17. A method for manufacturing a wireless IC device including a radiation plate, a wireless IC chip, and a substrate on which the wireless IC chip is mounted, the substrate being provided with a feed circuit, the feed circuit including at least one of a resonant circuit or a matching circuit, the at least one of the resonant circuit or the matching circuit including an inductance element, the feed circuit being electromagnetically coupled to the radiation plate, the method comprising the steps of:

forming a wedge member such that the wedge member extends between a first main surface of the substrate made of a resin material and a second main surface thereof spaced apart from a wiring electrode, the wiring electrode being formed in advance on the first main surface of the substrate and connected to the feed circuit, using a different material from the resin material;

forming a recess in the substrate by pressing a portion of the first main surface of the substrate, a portion of the wiring electrode, and the wedge member, so that the wiring electrode extends along a bottom surface of the recess and so that the wedge member extends between the bottom surface of the recess and the second main surface of the substrate; and mounting the wireless IC chip in the recess so as to couple the wireless IC chip to the wiring electrode; wherein the wedge member is arranged to prevent return-deformation of portions of the substrate close to the recess.

18. A method for manufacturing a wireless IC device including a radiation plate, a wireless IC chip, and a substrate on which the wireless IC chip is mounted, the substrate being provided with a feed circuit, the feed circuit including at least one of a resonant circuit or a matching circuit, the at least one of the resonant circuit or the matching circuit including an inductance element, the feed circuit being electromagnetically coupled to the radiation plate, the method comprising the steps of:

forming a wedge member such that the wedge member extends between a first main surface of the substrate made of a resin material and a second main surface thereof spaced apart from a wiring electrode, using a different material different from the resin material, the wiring electrode being formed in advance on the first main surface of the substrate and connected to the feed circuit; and forming a recess, in which the wireless IC chip is to be embedded, on the substrate by pressing the wireless IC chip against the first main surface of the substrate in a state in which the wireless IC chip is mounted on the first main surface of the substrate such that the wireless IC chip is opposed to the wiring electrode on the substrate, so that the wiring electrode extends along a bottom surface of the recess, and so that the wedge member extends between the bottom surface of the recess and the second main surface of the substrate; wherein the wedge member is arranged to prevent return-deformation of portions of the substrate close to the recess.

* * * * *